US011855199B2

(12) United States Patent
Yeh et al.

(10) Patent No.: US 11,855,199 B2
(45) Date of Patent: Dec. 26, 2023

(54) HIGH ELECTRON MOBILITY TRANSISTOR (HEMT) WITH A BACK BARRIER LAYER

(71) Applicant: Taiwan Semiconductor Manufacturing Co., Ltd., Hsinchu (TW)

(72) Inventors: Chia-Ling Yeh, Hsinchu (TW); Pravanshu Mohanta, Maharashtra (IN); Ching-Yu Chen, Hsinchu (TW); Jiang-He Xie, Hsinchu (TW); Yu-Shine Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 195 days.

(21) Appl. No.: 17/083,715

(22) Filed: Oct. 29, 2020

(65) Prior Publication Data

US 2022/0140123 A1 May 5, 2022

(51) Int. Cl.

| | |
|---|---|
| ***H01L 29/778*** | (2006.01) |
| ***H01L 21/02*** | (2006.01) |
| ***H01L 21/306*** | (2006.01) |
| ***H01L 29/20*** | (2006.01) |
| ***H01L 29/205*** | (2006.01) |
| ***H01L 29/66*** | (2006.01) |

(52) U.S. Cl.

CPC ...... *H01L 29/7786* (2013.01); *H01L 21/0254* (2013.01); *H01L 21/02381* (2013.01); *H01L 21/02433* (2013.01); *H01L 21/02458* (2013.01); *H01L 21/30612* (2013.01); *H01L 29/2003* (2013.01); *H01L 29/205* (2013.01); *H01L 29/66462* (2013.01)

(58) Field of Classification Search

None

See application file for complete search history.

(56) References Cited

FOREIGN PATENT DOCUMENTS

CN 107735863 A * 2/2018 ........... H01L 29/778

* cited by examiner

*Primary Examiner* — Jack S Chen

(74) *Attorney, Agent, or Firm* — Duane Morris LLP

(57) ABSTRACT

Disclosed is a semiconductor device and a method for fabricating such semiconductor device, specifically a High Electron Mobility Transistor (HEMT) with a back barrier layer for blocking electron leakage and improve threshold voltage. In one embodiment, a semiconductor device, includes: a Gallium Nitride (GaN) layer; a front barrier layer over the GaN layer; a source electrode, a drain electrode and a gate electrode formed over the front barrier layer; a 2-Dimensional Electron Gas (2-DEG) in the GaN layer at a first interface between the GaN layer and the front barrier layer; and a back barrier layer in the GaN layer, wherein the back barrier layer comprises Aluminum Nitride (AlN).

20 Claims, 14 Drawing Sheets

200
220
214
D1
D2
216
218
212
208b
210
208a
206
204
202

200

202

200

200

200

430

440

HIGH ELECTRON MOBILITY TRANSISTOR (HEMT) WITH A BACK BARRIER LAYER

BACKGROUND

High Electron Mobility Transistors (HEMTs) are a type of solid state transistors. Typically, HEMTs are fabricated from small bandgap semiconductor materials, such as Silicon (Si) and Gallium Arsenide (GaAs) which suffer from high source resistance, low breakdown voltage, and poor performance at high frequencies. Large bandgap semiconductor materials, such as Gallium Nitride (GaN), which can also provide high peak and saturation electron velocity values become promising candidates for solving aforementioned problems. Furthermore, GaN-based HEMTs with an Aluminum Gallium Nitride/Gallium Nitride (AlGaN/GaN) structure wherein a 2-dimensional Electron Gas (2-DEG) with high electron mobility is formed at the AlGaN/GaN interface, have been developed for high frequency, high temperature and high power applications.

However, leakage of the electrons in the 2-DEG in AlGaN/GaN HEMTs can increase a source-drain leakage current and thus reduce the threshold voltage, degrading the device performance. Therefore, there exists a need to develop a method to improve the performance of AlGaN/GaN HEMTs, specifically a method to reduce the source-drain leakage current and increase the threshold voltage.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

This disclosure presents various embodiments of a High Electron Mobility Transistor (HEMT) with a back barrier layer and a method for fabricating the HEMT to reduce electron leakage in a 2-DEG so as to further improve threshold voltage and performance of HEMT devices.

Figure 1:
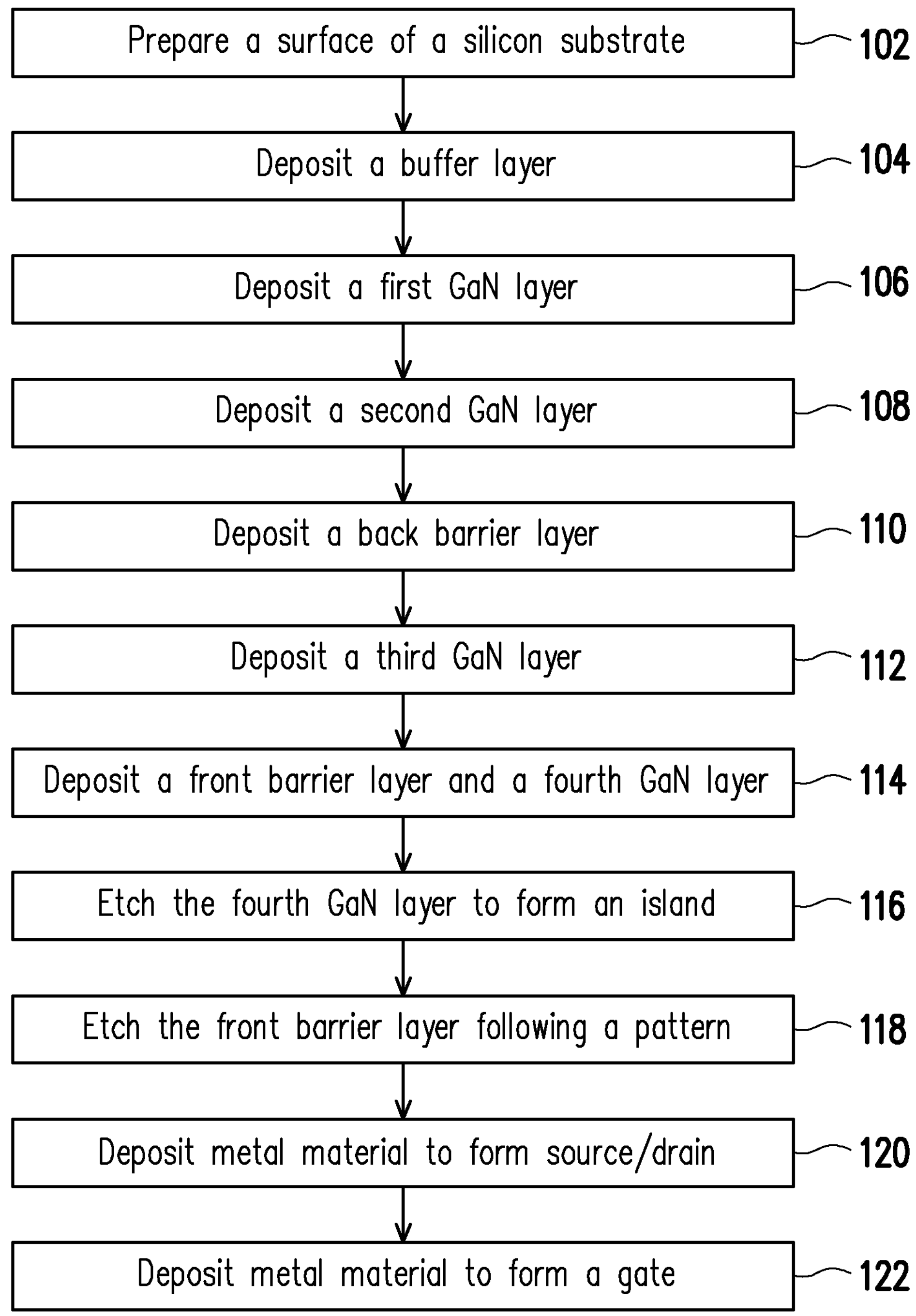
FIG. 1 illustrates a flow chart of an exemplary method for forming a High Electron Mobility Transistor (HEMT) with a back barrier layer, in accordance with some embodiments of the present disclosure.

FIG. 1 illustrates a flowchart of a method 100 to form a High Electron Mobility Transistor (HEMT) with a back barrier layer, in accordance with some embodiments of the present disclosure. It is noted that the method 100 is merely an example, and is not intended to limit the present disclosure. Accordingly, it is understood that additional operations may be provided before, during, and after the method 100 of FIG. 1, and that some other operations may only be briefly described herein. In some embodiments, operations of the method 100 may be associated with cross-sectional views of a semiconductor device at various fabrication stages as shown in FIGS. 2A-2J, which will be discussed in further detail below.

Referring now to FIG. 1, the method 100 starts with operation 102 in which a substrate is provided and prepared according to some embodiments. In some embodiments, the substrate comprises Si with a surface orientation of <111>. The method 100 continues with operation 104 in which a buffer layer is deposited on the substrate. In some embodiments, the buffer layer is deposited on a polished surface of the substrate according to some embodiments. In some embodiments, the buffer layer comprises group III-Nitride compound semiconductors to reduce lattice mismatch between the substrate and a subsequent GaN layer, e.g., AlN and AlGaN. The method 100 continues with operation 106 in which a first GaN layer is deposited over the first buffer layer on the substrate according to some embodiments. In some embodiments, the first GaN layer is conductive with an electrical resistivity higher than a resistivity of the second GaN layer. The method 100 continues with operation 108 in which the second GaN layer is deposited over the first GaN layer. In some embodiments, the second GaN layer contains no intentional doping and is an intrinsic GaN layer with a thickness in a range of 200-4000 nm. The method 100 continues with operation 110 in which aback barrier layer is deposited over the second GaN layer according to some embodiments. In some embodiments, the back barrier layer comprises group III-Nitride compound semiconductors, comprising at least one of the following: Aluminum (Al), Gallium (Ga) and Indium (In) in forms of binary, ternary or tertiary compounds. In some embodiments, the back barrier layer comprises $Al_xGa_{1-x}N$, wherein $0 \leq x \leq 1$. The method 100 continues with operation 112 in which a third GaN layer is deposited on the back barrier layer according to some embodiments. In some embodiments, the third GaN layer contains no intentional doping and is an intrinsic GaN layer with a thickness in a range of 25-350 nm. In some embodiments, the summation of the thickness of the second GaN layer and the thickness of the third GaN layer is in a range of 200-4000 nm. The method 100 continues with operation 114 in which a front barrier layer is deposited over the third GaN layer and a fourth GaN layer is formed over the front barrier layer according to some embodiments. In some embodiments, the front barrier layer comprises group III-Nitride compound semiconductors, comprising at least one of the following: Aluminum (Al), Gallium (Ga) and Indium (In) in forms of binary, ternary or tertiary compounds. In some embodiments, the front barrier layer comprises $Al_xGa_{1-x}N$, wherein $0 \leq x \leq 1$. In some embodiments, the front barrier layer is formed on the third GaN layer to form a 2DEG.

The method 100 continues with operation 116 in which the fourth GaN layer is etched to form an island region and expose part of the front barrier layer. At operation 118, the exposed front barrier layer is etched according to a pattern. At operation 120, a metal material is deposited onto the etched front barrier layer to form source and drain electrodes (i.e. source and drain contacts), thus forming source and drain regions of the HEMT. In some embodiments, doped semiconductor material is deposited on the etched front barrier layer before the metal material is deposited to form the source and drain. At operation 122, a metal material is deposited onto the island region of the fourth GaN layer to form a gate electrode (i.e. gate contact), thus forming a gate of the HEMT.

As mentioned above, FIG. 2A-2J illustrate cross-sectional views of an exemplary High Electron Mobility Transistor (HEMT) with a back barrier layer during various fabrication stages, in accordance with some embodiments of the present disclosure. FIGS. 2A-2J are simplified for a better understanding of the concepts of the present disclosure. Although the figures illustrate the HEMT 200, it is understood the IC may comprise a number of other devices such as resistors, capacitors, inductors, fuses, etc., which are not shown in FIGS. 2A-2J, for purposes of clarity of illustration.

Figures 2A, 2B:
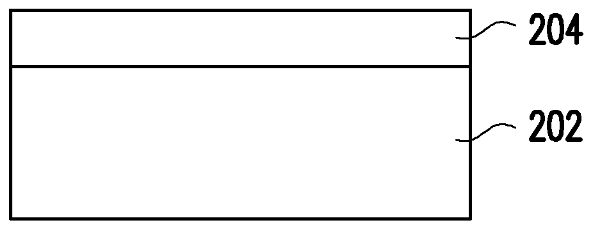
FIGS. 2A-2J illustrate cross-sectional views of an exemplary High Electron Mobility Transistor (HEMT) with a back barrier layer during various fabrication stages, in accordance with some embodiments of the present disclosure.

FIG. 2A is a cross-sectional view of the HEMT 200 including a substrate 202 at one of the various stages of fabrication corresponding to operation 102 of FIG. 1, in accordance with some embodiments of the present disclosure. In some embodiments, the substrate 202 is a Si substrate. In some embodiments, the substrate 202 is a single-side polished Si wafer with a surface orientation of <111> direction. In some embodiments, the substrate 202 has a surface offcut of 0.0±0.5°. In some embodiments, the substrate 202 has a doping type of and resistivity 1000-3000 ohm·cm. In some embodiments, the substrate 202 is cleaned using an RCA cleaning process and a vacuum annealing process Alternatively, the substrate 202 may include other elementary semiconductor material such as, for example, germanium (Ge). The first substrate 202 may also include a compound semiconductor such as sapphire, silicon carbide (SiC), GaAs, GaN, indium arsenide (InAs), and indium phosphide (In2P3). The substrate 202 may include an alloy semiconductor such as SiGe, SiGeC, gallium arsenic phosphide (GaAsP), and gallium indium phosphide (GaInP). In some embodiments, the SiC is one of the following polytypes: 4H, 3C, 6H and 15R. In one embodiment, the substrate 202 includes an epitaxial layer.

FIG. 2B is a cross-sectional view of the HEMT 200 including the substrate 202 and a buffer layer 204 at one of the various stages of fabrication corresponding to operation 104 of FIG. 1, in accordance with some embodiments of the present disclosure. In some embodiments, before depositing the buffer layer 204 on the polished surface of the substrate 202 (e.g., Si <111>), the substrate 202 etched in buffered oxide etchant typically containing hydrofluoric (HF) acid or vacuum annealing at high temperature in the range of 900-1200 C, to remove a native oxide layer formed on the polished surface of the substrate 202.

In some embodiments, the buffer layer 204 comprises group III-Nitride compound semiconductors, comprising at least one of the following: Aluminum (Al), Gallium (Ga) and Indium (In) in forms of binary, ternary or tertiary compounds. In some embodiments, the buffer layer 204 is formed on the polished Si <111> surface to reduce the lattice mismatch between the substrate 202 and following layers in the HEMT 200 (e.g., a first GaN layer). In some embodiments, the buffer layer 204 is deposited using one of the following techniques: metal organic chemical vapor deposition (MOCVD), molecular beam epitaxy (MBE), chemical vapor deposition (CVD), and physical vapor deposition (PVD). In some embodiments, the buffer layer 204 has a thickness of about 100-350 nanometers (nm). In some embodiments, the transition layer comprises a graded aluminum gallium nitride layer ($Al_xGa_{1-x}N$), wherein the x value is the aluminum content in the allium gallium constituent, $0<x<1$. In some embodiments, the graded aluminum gallium nitride layer comprises a plurality of layers, wherein the x value decreases across the plurality of layers from the bottom layer to the top layer. For example, the graded aluminum gallium nitride layer comprises three layers having the x ratio in the range of 0.5-0.9 for the bottom layer, in the range of 0.4-0.7 for the middle layer, and in the range of 0.1-0.5 for the top layer. In some embodiments, the thickness of the transition layer 204 is in a range of 500-2500 nm.

Figure 2C:
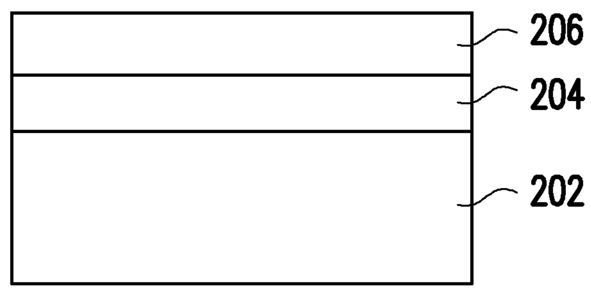

FIG. 2C is a cross-sectional view of the HEMT 200 including the substrate 202, the buffer layer 204 and a first GaN layer 206 at one of the various stages of fabrication corresponding to operation 106 of FIG. 1, in accordance with some embodiments of the present disclosure. In some embodiments, the first GaN layer 206 is deposited using one of the following techniques: metal organic chemical vapor deposition (MOCVD), molecular beam epitaxy (MBE), chemical vapor deposition (CVD), and physical vapor deposition (PVD). In some embodiments, the thickness of the first GaN layer 206 is in a range of x 200-4000 nm. In some embodiments, the first GaN layer 206 is a conductive GaN layer. In some embodiments, the conductive GaN layer 206 is doped with the p-type dopant including at least one of the following elements, carbon (C), iron (Fe) magnesium (Mg), and zinc (Zn). The first GaN layer 206 has a resistivity higher than a resistivity of the channel layer, for increasing the breakdown voltage of the HEMT device structure.

Figure 2D:
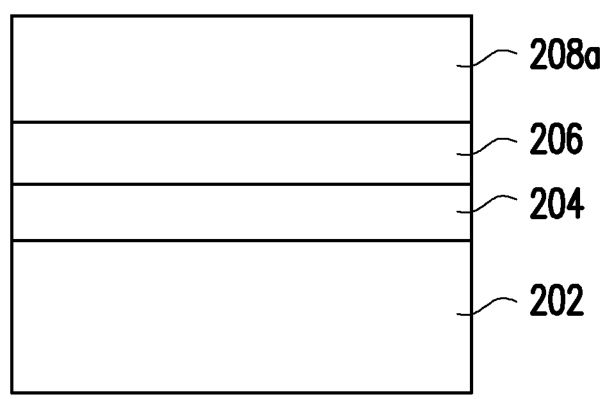

FIG. 2D is a cross-sectional view of the HEMT 200 including the substrate 202, the buffer layer 204, the first GaN layer 206, and a second GaN layer 208A at one of the various stages of fabrication corresponding to operation 108 of FIG. 1, in accordance with some embodiments of the present disclosure. In some embodiments, the second GaN layer 208A is deposited using one of the following techniques: metal organic chemical vapor deposition (MOCVD), molecular beam epitaxy (MBE), chemical vapor deposition (CVD), and physical vapor deposition (PVD). In some embodiments, the thickness of the second GaN layer 208A is in a range of 200-3625 nm. In some embodiments, the second GaN layer 208A is an intrinsic GaN layer. In some embodiments, the intrinsic GaN layer 208A contains no intentional doping. The second GaN layer 208A has a lower resistivity than the transition layer 204, for improving the current performance of the HEMT device.

Figure 2E:
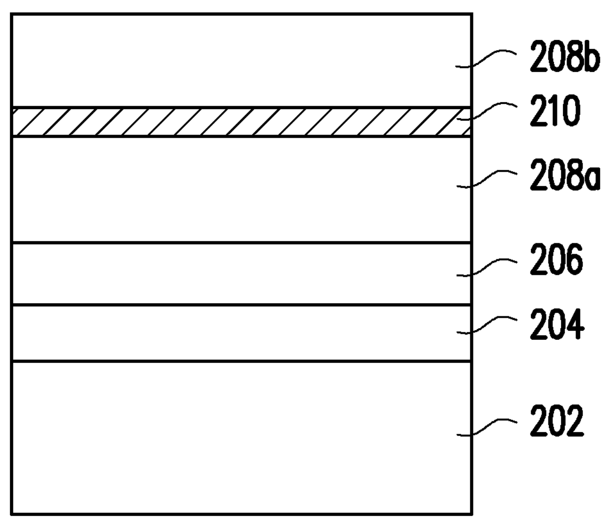

FIG. 2E is a cross-sectional view of the HEMT 200 including a back barrier layer 210 and a third GaN layer 208B, at one of the various stages of fabrication corresponding to operations 110 and 112 of FIG. 1, in accordance with some embodiments of the present disclosure. In some embodiments, the back barrier layer 210 comprises group III-Nitride compound semiconductors, comprising at least one of the following: Aluminum (Al), Gallium (Ga) and Indium (In) in forms of binary, ternary or tertiary compounds. In some embodiments, the back barrier layer 210 comprises $Al_xGa_{1-x}N$, wherein $0 \leq x \leq 1$. In some embodiments, the back barrier layer 210 is deposited using one of the following techniques: metal organic chemical vapor deposition (MOCVD), molecular beam epitaxy (MBE), chemical vapor deposition (CVD), and physical vapor deposition (PVD). In some embodiments, the thickness of the back barrier layer 206 is in a range of 0.2-15 nm. In some embodiments, the back barrier layer 210 is an AlN layer.

In some embodiments, the third GaN layer 208B is deposited using one of the following techniques: metal organic chemical vapor deposition (MOCVD), molecular beam epitaxy (MBE), chemical vapor deposition (CVD), and physical vapor deposition (PVD). In some embodiments, the third GaN layer 208B has a thickness of about 25-350 nm. In some embodiments, the summation of the thickness of the second GaN layer 208A and the thickness of the third GaN layer 208B is in a range of 200-4000 nm. In some embodiments, the third GaN layer 208B is an intrinsic GaN layer. In some embodiments, the intrinsic GaN layer 208B contains no intentional doping and has a lower resistivity than the transition layer.

Figure 2F:
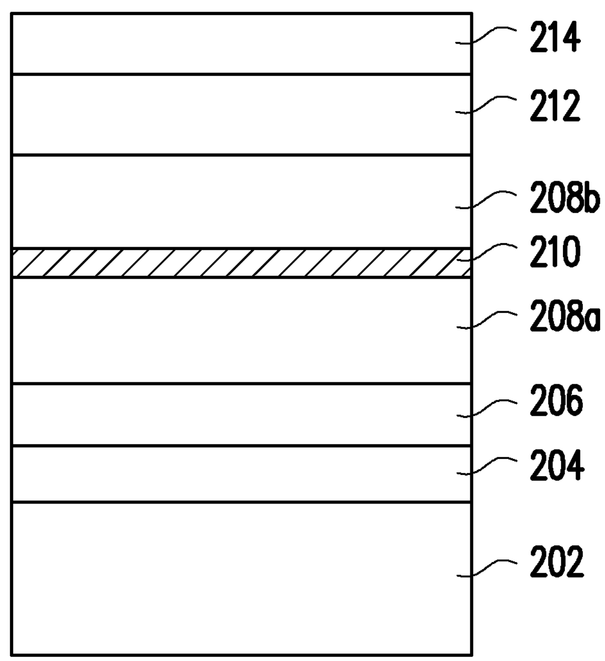

FIG. 2F is a cross-sectional view of the HEMT 200 including a front barrier layer 212 and a fourth GaN layer 214, at one of the various stages of fabrication corresponding to operation 114 of FIG. 1, in accordance with some embodiments of the present disclosure. In some embodiments, the front barrier layer 212 comprises group III-Nitride compound semiconductors, comprising at least one of the following: Aluminum (Al), Gallium (Ga) and Indium (In) in forms of binary, ternary or tertiary compounds. In some embodiments, the front barrier layer 212 comprises $Al_xGa_{1-x}N$, wherein $0 \leq x \leq 1$. In some embodiments, the front barrier layer 212 is formed on the third GaN layer 208B to form a 2DEG. In some embodiments, the front barrier layer 212 is deposited using one of the following techniques: metal organic chemical vapor deposition (MOCVD), molecular beam epitaxy (MBE), chemical vapor deposition (CVD), and physical vapor deposition (PVD). In some embodiments, the thickness of the front barrier layer 212 is in a range of 10-100 nm. In some embodiments, the thickness of the front barrier layer 212 is determined by the Al composition (i.e., value of x) of the front barrier layer 212.

In some embodiments, the fourth GaN layer 214 is deposited using one of the following techniques: metal organic chemical vapor deposition (MOCVD), molecular beam epitaxy (MBE), chemical vapor deposition (CVD), and physical vapor deposition (PVD). In some embodiments, the fourth GaN layer 214 has a thickness of about 20-100 nm. In some embodiments, the fourth GaN layer 214 is a p-doped GaN layer (p-GaN) and p-doped AlGaN (p-AlGaN), including at least one of the following elements carbon (C), iron (Fe) magnesium (Mg) and zinc (Zn) with a doping concentration in a range from 1E+18 to 1E+21 atom/cm3.

Figure 2G:
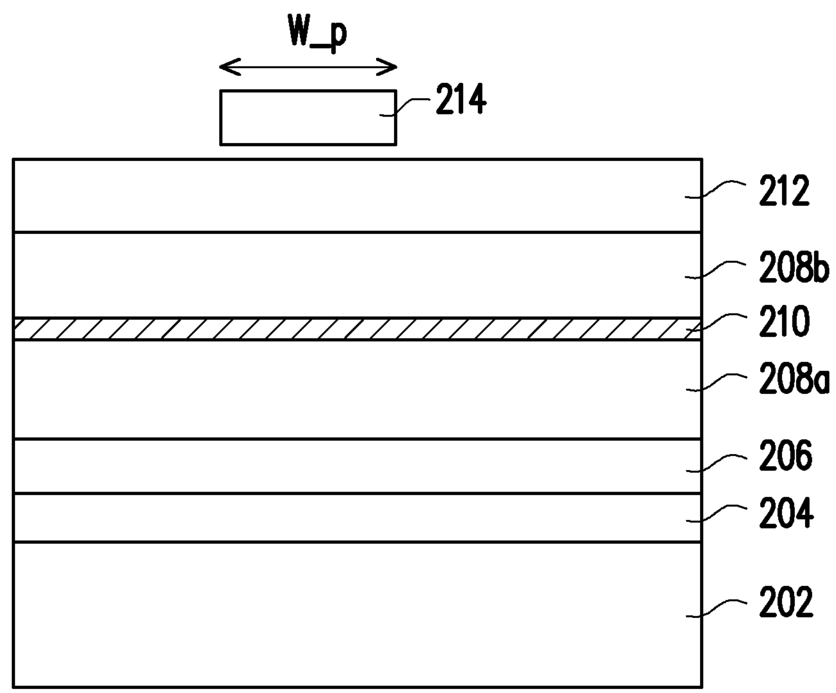

FIG. 2G is a cross-sectional view of the HEMT 200 including the patterned GaN layer 214, at one of the various stages of fabrication corresponding to operation 116 of FIG. 1, in accordance with some embodiments of the present disclosure. The GaN layer 214 is patterned to form an island region shown in FIG. 2G. In some embodiments, the patterning of the GaN layer 214 includes, e.g., (i) forming a masking layer (e.g., photoresist, etc.) over the GaN layer 214, the masking layer including openings over the portions of the GaN layer 214 that are to be removed, and (ii) removing the portions of the GaN layer 214 that are left exposed by the masking layer (e.g., via a wet or dry etch procedure). As shown in FIG. 2G, after patterning of the GaN layer 214, portions of the front barrier layer 212 is exposed without coverage of the GaN layer 214. In some embodiments, the island region of the GaN layer 214 defines a position for a gate to be formed thereon and has a width W_p that is in a range of 1 to 3 micrometers.

Figure 2H:
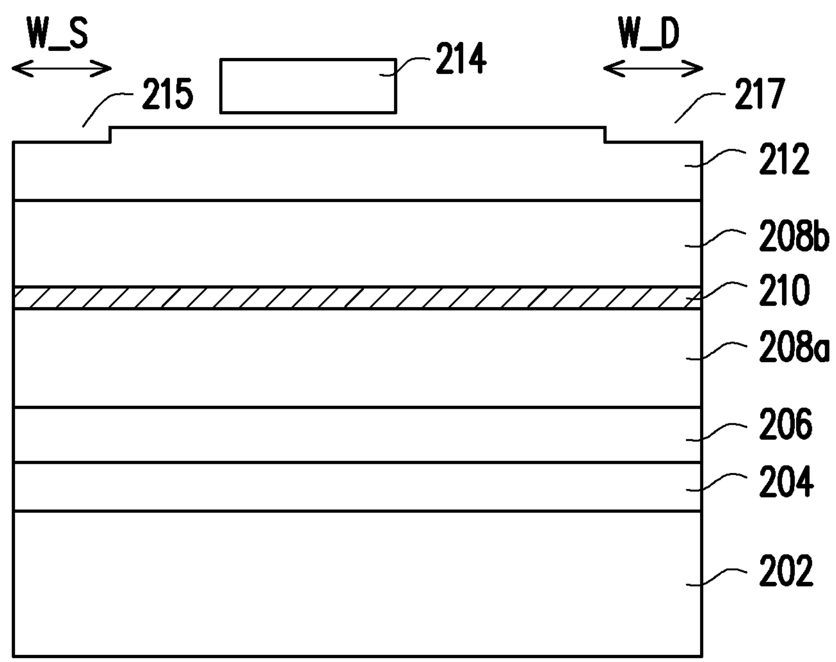

FIG. 2H is a cross-sectional view of the HEMT 200 including the patterned front barrier layer 212, at one of the various stages of fabrication corresponding to operation 118 of FIG. 1, in accordance with some embodiments of the present disclosure. The front barrier layer 212 is patterned to form two trenches 215, 217 shown in FIG. 2H. In some embodiments, the patterning of the front barrier layer 212 includes, e.g., (i) forming a masking layer (e.g., photoresist, etc.) over the exposed front barrier layer 212, the masking layer including openings over the portions of the front barrier layer 212 that are to be removed, and (ii) removing the portions of the front barrier layer 212 that are left exposed by the masking layer (e.g., via a wet or dry etch procedure). In some embodiments, the trench 215 of the patterned front barrier layer 212 defines a position for a source to be formed and has a width W_S that is in a range of 1 to 5 micrometers. In some embodiments, the trench 217 of the patterned front barrier layer 212 defines a position for a drain to be formed and has a width W_D that is in a range of 1 to 5 micrometers.

Figure 2I:
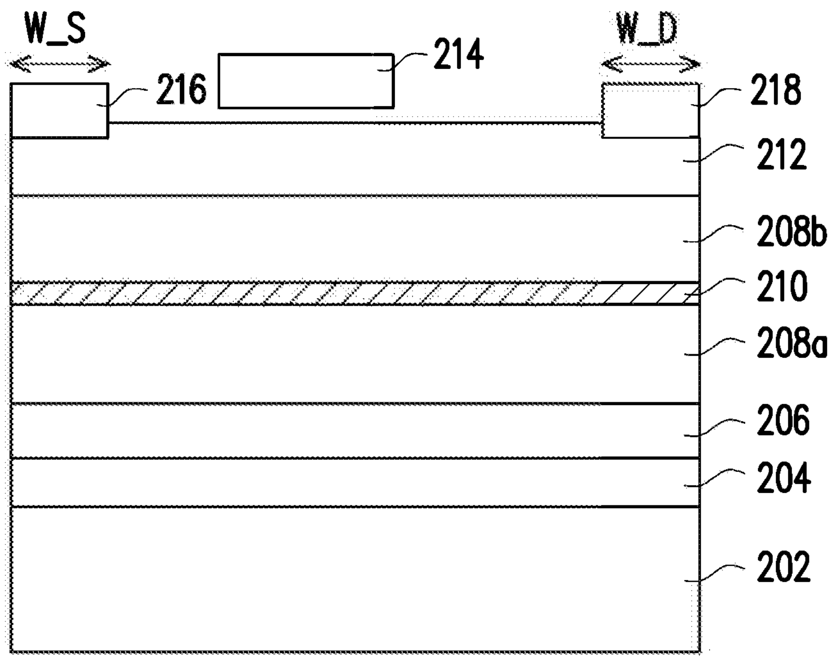

FIG. 2I is a cross-sectional view of the HEMT 200 including source and drain electrodes 216, 218 of the HEMT 200, at one of the various stages of fabrication corresponding to operation 120 of FIG. 1, in accordance with some embodiments of the present disclosure. As shown in FIG. 2I, the source electrode 216 is deposited into the trench 215 of the front barrier layer 212; and the source electrode 218 is deposited into the trench 217 of the front barrier layer 212. As such, the source electrode 216 has a width W_S that is in a range of 1 to 5 micrometers; and the source electrode 218 has a width W_D that is in a range of 1 to 5 micrometers. In some embodiments, the source electrode 216 and the drain electrode 218 may be made of a stack of metal layers. The metal layers may be made of Co, Ni, W, Pt, Ta, Pd, Mo, TiN, Al—Cu alloy or other applicable materials. In some embodiments, each of the source/drain electrodes 216, 218 includes a bottom Ti/TiN layer, an AlCu layer overlying the bottom Ti/TiN layer, and a top Ti layer overlying the AlCu layer. In some embodiments, the source electrode 216 and the drain electrode 218 are deposited using one of the following techniques: chemical vapor deposition (CVD), atomic layer deposition (ALD), physical vapor deposition (PVD) or other applicable process.

Figure 2J:
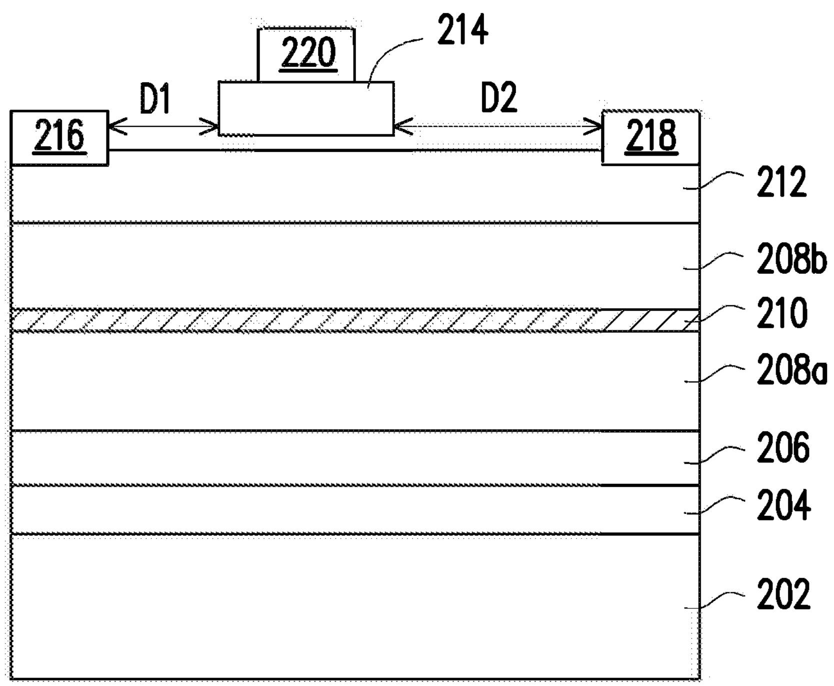

FIG. 2J is a cross-sectional view of the HEMT 200 including a gate electrode 220 of the HEMT 200, at one of the various stages of fabrication corresponding to operation 122 of FIG. 1, in accordance with some embodiments of the present disclosure. As shown in FIG. 2J, the gate electrode 220 is deposited onto the island region of the fourth GaN layer 214. In some embodiments, the gate electrode 220 has a width that is in a range of 1 to 3 micrometers. In some embodiments, the distance D1 between the source electrode 216 and the island region of the fourth GaN layer 214 is in a range of 0.1 to 5 micrometers; while the distance D2 between the drain electrode 218 and the island region of the fourth GaN layer 214 is in a range of 10 to 40 micrometers. In some embodiments, the gate electrode 220 may be made of a stack of metal layers. The metal layers may be made of Co, Ni, W, Pt, Ta, Pd, Mo, TiN, Al—Cu alloy or other applicable materials. In some embodiments, the gate electrode 220 includes a bottom Ti/TiN layer, an AlCu layer overlying the bottom Ti/TiN layer, and a top Ti layer overlying the AlCu layer. In some embodiments, the gate electrode 220 is deposited using one of the following techniques: chemical vapor deposition (CVD), atomic layer deposition (ALD), physical vapor deposition (PVD) or other applicable process.

In some embodiments, the HEMT 200 may further include a passivation layer (not shown) formed over the source electrode 216, the drain electrode 218, the gate electrode 220 and the island region of the fourth GaN layer 214. The passivation layer may be made of silicon oxide, silicon nitride, silicon oxynitride. In some embodiments, the passivation layer is deposited using one of the following techniques: chemical vapor deposition (CVD) and atomic layer deposition (ALD).

Figure 3:
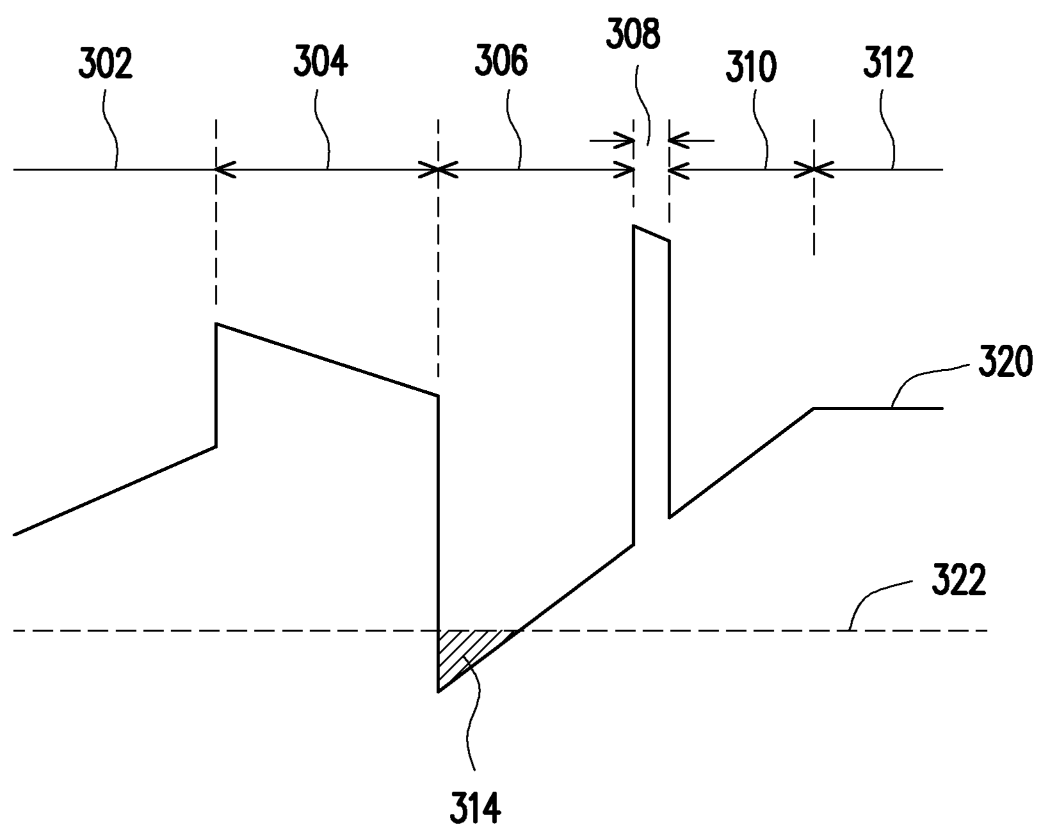
FIG. 3 illustrates a conduction band profile of a High Electron Mobility Transistor (HEMT) with a back barrier layer at equilibrium, in accordance with some embodiments of the present disclosure.

FIG. 3 illustrates a conduction band profile 300 of a High Electron Mobility Transistor (HEMT) with a back barrier layer at equilibrium, in accordance with some embodiments of the present disclosure. In the illustrated embodiment, the conduction band profile 300 is illustrated vertically through the HEMT 200 from the fourth GaN layer 214 to the first GaN layer 206. In the illustrated embodiment, the energy band diagram 300 comprises 6 regions, a first region 302, a second region 304, a third region 306, a fourth region 308, a fifth region 310 and a sixth region 312 corresponding to the fourth GaN layer 214, the front barrier layer 212, the third GaN layer 208B, the back barrier layer 210, the second GaN layer 208A, and the first GaN layer 206, respectively. In the illustrated embodiment, conduction band edges of corresponding layers of the HEMT 200 are depicted as a solid line 320 and Fermi levels of corresponding layers of the HEMT 200 are depicted as a broken line 322.

At the interface between the second region 304 corresponding to the front barrier layer 212 and the third region 306 corresponding to the third GaN layer 208B, a 2-DEG 314 in the third GaN layer 208B is generated by the spontaneous piezoelectric polarization and donor states on the front barrier layer 212 (i.e., AlGaN). Unlike a HEMT without a back barrier layer, electrons in the 2-DEG 314 can be blocked by the fourth region 308 corresponding to the back barrier layer 210 caused by the large bandgap of the back barrier layer 210 and the large conduction band offset. In some embodiments, the back barrier layer 210 is an electron blocking layer (EBL) which effectively reduce the electron leakage from the 2-DEG, thus provide improved confinement of electrons in the 2-DEG.

Figure 4A:
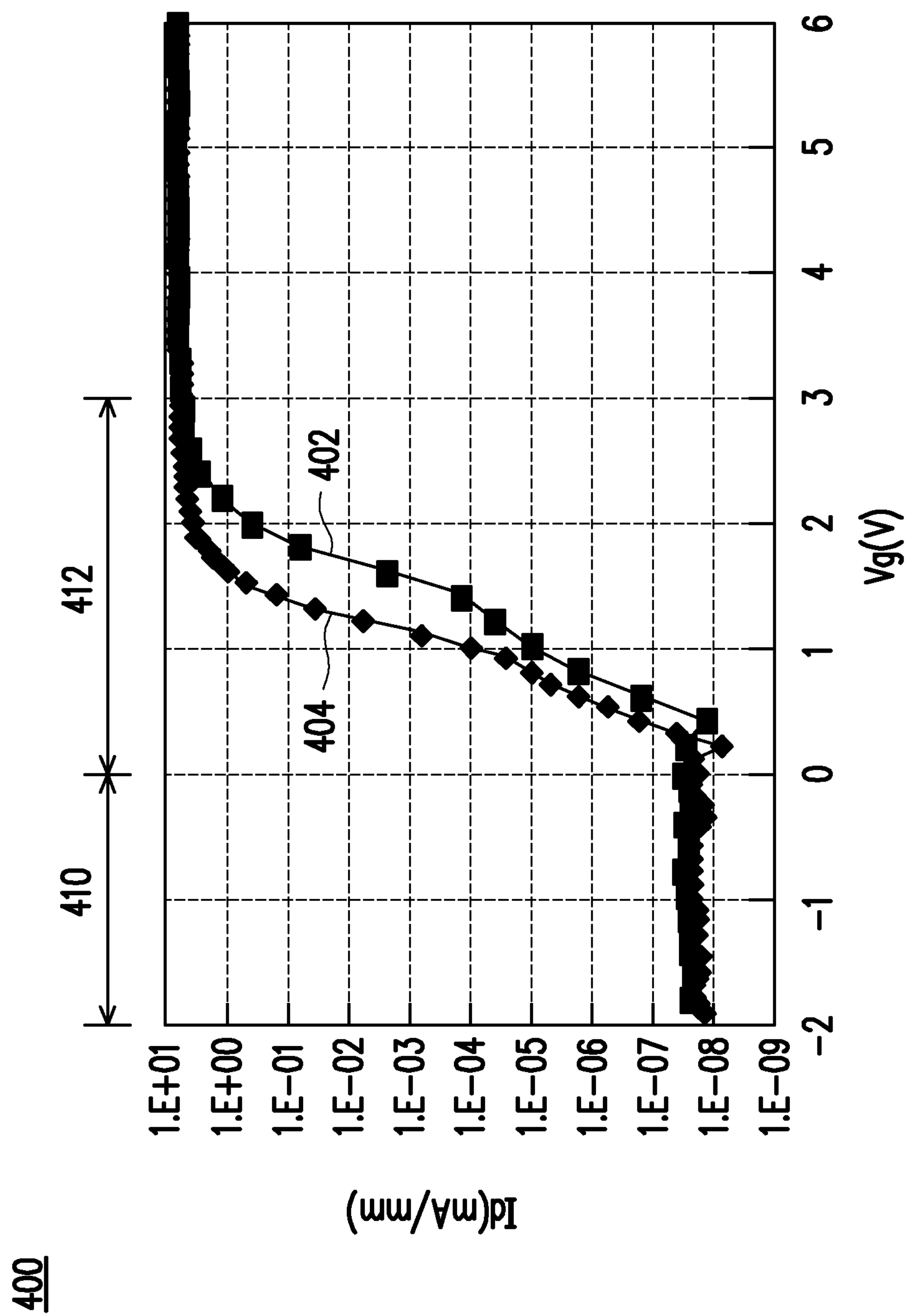
FIG. 4A illustrates a comparison of DC transfer characteristics (source-drain current versus gate-source voltage) in a semi-logarithm scale of a High Electron Mobility Transistor (HEMT) with a back barrier layer and a HEMT without a back barrier layer, in accordance with some embodiments of the present disclosure.

FIG. 4A illustrates a comparison of DC transfer characteristics 400 (source-drain current versus gate voltage) in a semi-logarithm scale of a High Electron Mobility Transistor (HEMT) 200 with a back barrier layer and a HEMT without a back barrier layer, in accordance with some embodiments of the present disclosure. In some embodiments, the DC transfer characteristics 400 on HEMTs are measured at a constant source-drain voltage (Vds) of 0.1 V. In the illustrated embodiment, the source-drain current (Ids) 402 of the HEMT with a back barrier layer in milliamper per millimeter (mA/mm) is higher than the Ids 404 of the HEMT without a back barrier layer at a given gate voltage (Vg) in a first region 410 (i.e., Vg≤0 V).

In the illustrated embodiment, the Ids 402 of the HEMT with a back barrier layer is generally lower than the Ids 404 of the HEMT without a back barrier layer at a given Vg in a second region 412 (i.e., 0<Vg≤3 V). The threshold voltage of the HEMT with a back barrier layer is higher than that of the HEMT without a back barrier layer. In one embodiment, for a HEMT with a back barrier layer having a vertical distance of about 100 nm from the front barrier layer, i.e. when the third GaN layer 208B in FIG. 2J has a thickness of about 100 nm, the HEMT with the back barrier layer has a threshold voltage about 25% higher than that of the HEMT without a back barrier layer. In some embodiments, the threshold voltage is measured at a constant current method of Vt linear measurement. Vt is simply defined as Vgs when Id matches some user-specified criteria.

Figure 4B:
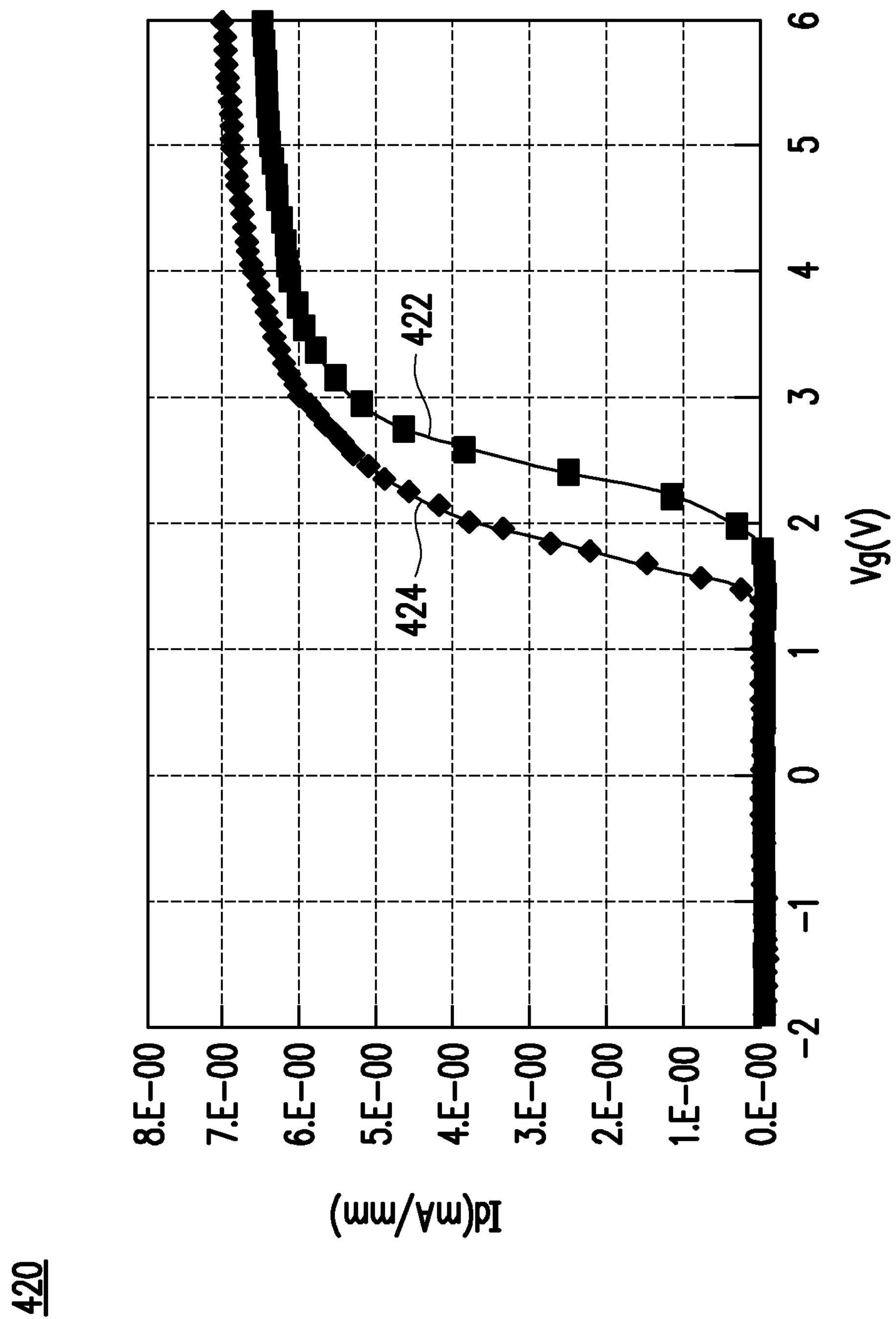
FIG. 4B illustrates a comparison of DC transfer characteristics (source-drain current versus gate-source voltage) of a High Electron Mobility Transistor (HEMT) with a back barrier layer and a HEMT without a back barrier layer, in accordance with some embodiments of the present disclosure.

FIG. 4B illustrates a comparison of DC transfer characteristics 420 (source-drain current versus gate-source voltage) of a High Electron Mobility Transistor (HEMT) with a back barrier layer and a HEMT without a back barrier layer, in accordance with some embodiments of the present disclosure. In some embodiments, the DC transfer characteristics 420 on HEMTs are measured at a constant source-drain voltage (Vds). In the illustrated embodiment, the saturated Ids 422 of the HEMT with a back barrier layer is smaller than the saturated Ids 424 of the HEMT without a back barrier layer at Vg of 6 V.

Figure 4C:
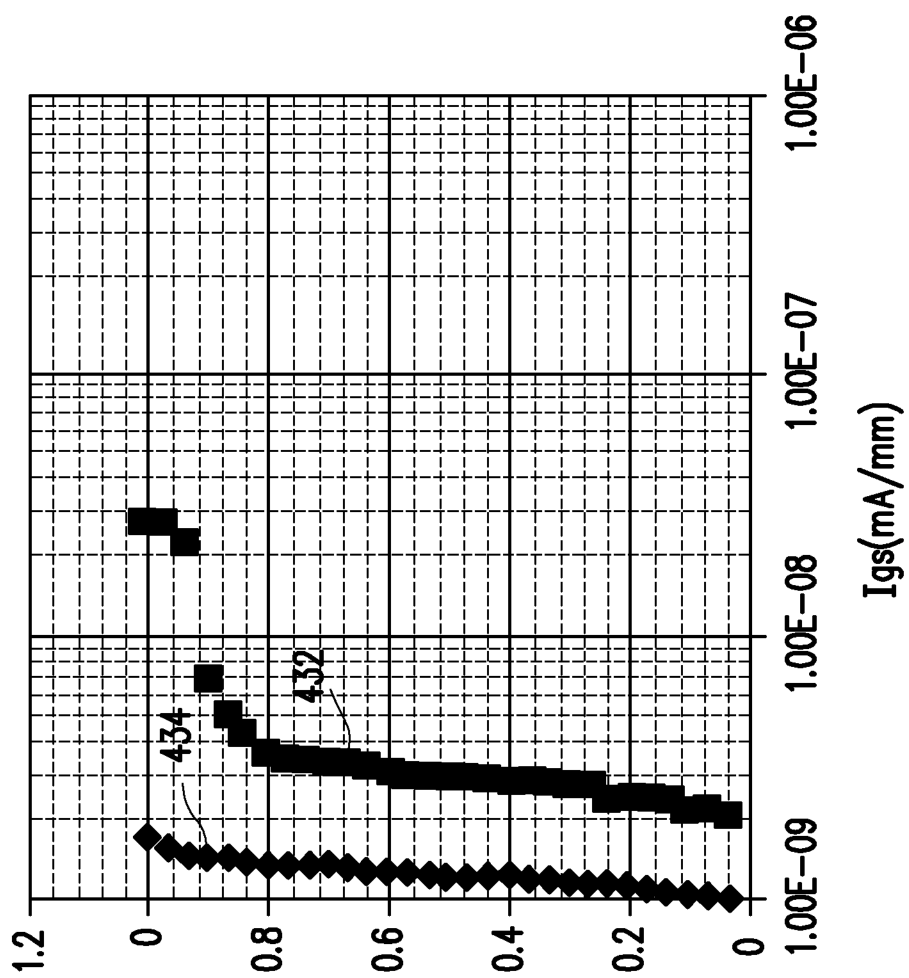
FIG. 4C illustrates a p control chart of drain leakage current of a High Electron Mobility Transistor (HEMT) with a back barrier layer and a HEMT without a back barrier layer, in accordance with some embodiments of the present disclosure.
Figure 4D:
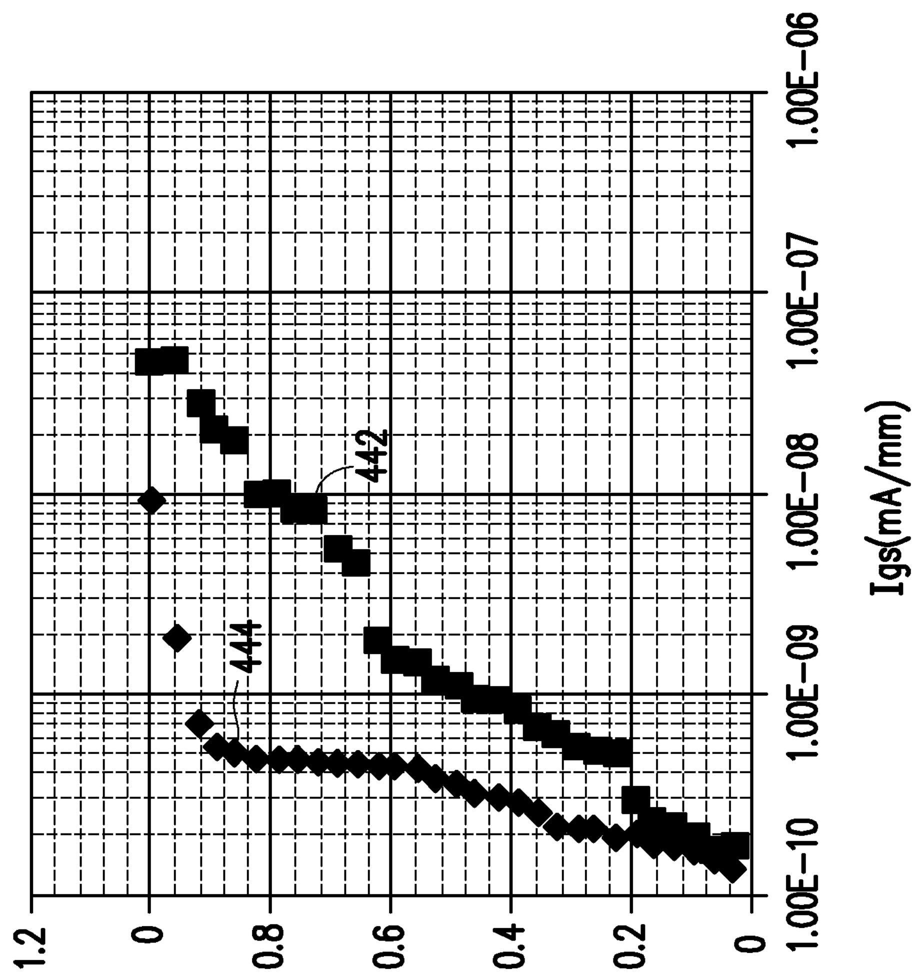
FIG. 4D illustrates a p control chart of source leakage current of a High Electron Mobility Transistor (HEMT) with a back barrier layer and a HEMT without a back barrier layer, in accordance with some embodiments of the present disclosure.

FIG. 4C illustrates a p control chart 430 of gate leakage current of a High Electron Mobility Transistor (HEMT) with a back barrier layer and a HEMT without a back barrier layer, in accordance with some embodiments of the present disclosure. In the illustrated embodiment, the gate leakage current (Ig_leak) is measured at a constant Vds of 200 V and Vg of 0 V. FIG. 4D illustrates a p-chat control chart 440 of source leakage current of a High Electron Mobility Transistor (HEMT) with a back barrier layer and a HEMT without a back barrier layer, in accordance with some embodiments of the present disclosure. In the illustrated embodiment, the source-drain leakage current (Ids leak) is measured at a constant Vds of 200 V and Vg of 0 V. In the chart, in the y-axis, 1 means 100% and the X-axis shows leakage source-drain current in units of mA/mm.

Figure 5A:
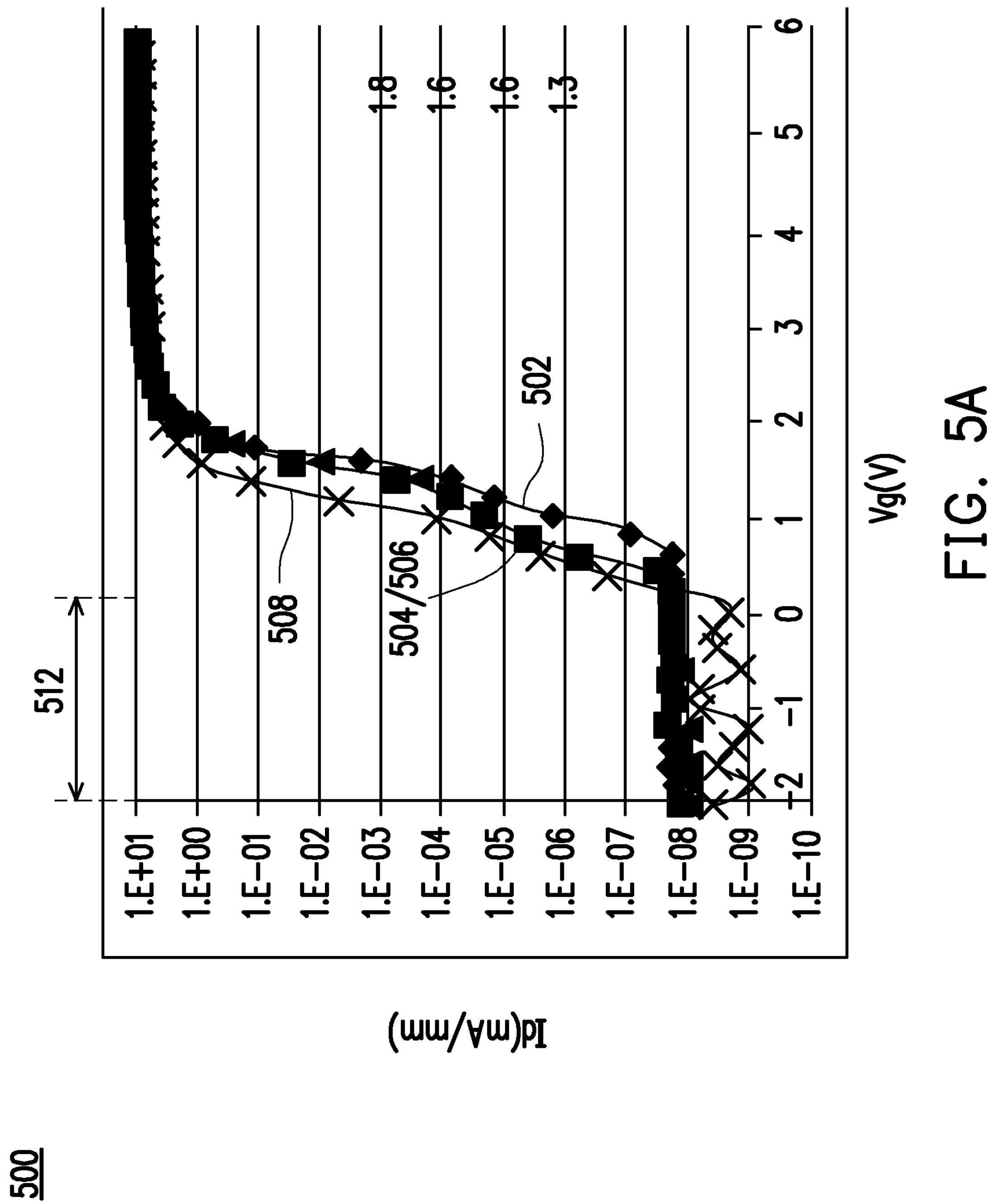
FIG. 5A illustrates a comparison of DC transfer characteristics (source-drain current versus gate-source voltage) in a semi-logarithm scale of High Electron Mobility Transistors (HEMTs) with a back barrier layer at different positions and a HEMT without a back barrier layer, in accordance with some embodiments of the present disclosure.

FIG. 5A illustrates a comparison of DC transfer characteristics 500 (source-drain current versus gate-source voltage) in a semi-logarithm scale of High Electron Mobility Transistors (HEMTs) with a back barrier layer at different positions and a HEMT without a back barrier layer, in accordance with some embodiments of the present disclosure. In some embodiments, the DC transfer characteristics 500 on HEMTs are measured at a constant source-drain voltage (Vds) of 0.1 V. In the illustrated embodiment, the back barrier layer is an AlN layer with a thickness of 10 nm located in the intrinsic GaN layer (i.e., between the second GaN layer 208A and the third GaN layer 208B) and has a vertical distance 25, 100 and 350 nm away from the front barrier layer 212. In the illustrated embodiment, the Ids 502/504/506 of the HEMT with a back barrier layer located 25, 100 and 350 nm away from the front barrier layer, respectively, are higher than the Ids 508 of the HEMT without a back barrier layer at a given gate voltage (Vg) in a subthreshold region 510 (i.e., Vg≤0 V).

In the illustrated embodiment, the Ids 502/504/506 of the HEMT with a back barrier layer located 25, 100 and 350 nm away from the front barrier layer, respectively, are higher than the Ids 508 of the HEMT without a back barrier layer at a given Vg in a subthreshold exponential region 512 (i.e., 0<Vg≤2 V). The threshold voltage of the HEMT with a back barrier layer is higher than that of the HEMT without a back barrier layer.

Figure 5B:
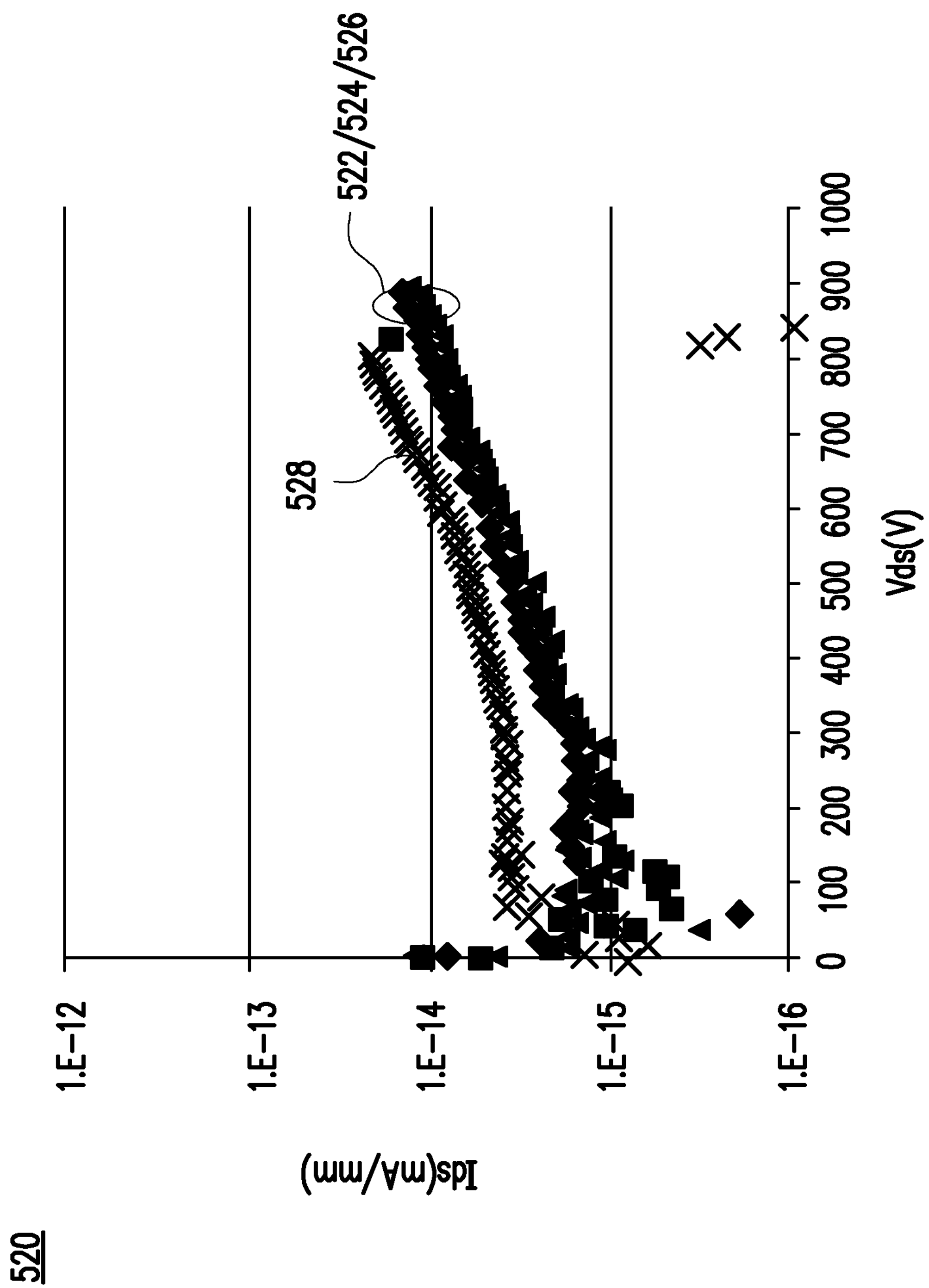
FIG. 5B illustrates a comparison of DC transfer characteristics (source-drain current versus source-drain voltage) of High Electron Mobility Transistors (HEMTs) with a back barrier layer at different positions and a HEMT without a back barrier layer, in accordance with some embodiments of the present disclosure.

FIG. 5B illustrates a comparison of DC transfer characteristics 520 (source-drain current versus source-drain voltage) of High Electron Mobility Transistors (HEMTs) with a back barrier layer at different positions and a HEMT without a back barrier layer, in accordance with some embodiments of the present disclosure. In the illustrated embodiment, the leakage Ids is measured at a constant Vg of 0 V.

Figure 5C:
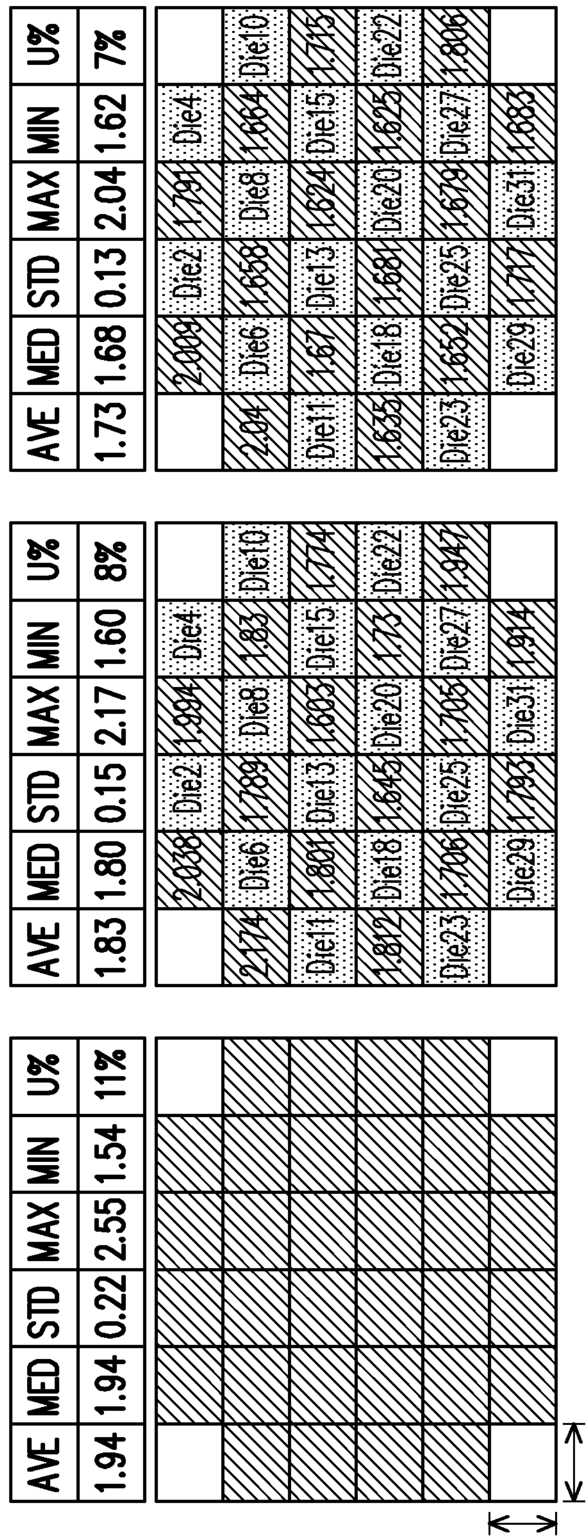
FIG. 5C illustrates wafer mappings of threshold values of High Electron Mobility Transistors (HEMTs) with a back barrier layer at different positions, in accordance with some embodiments of the present disclosure.

FIG. 5C illustrates wafer mappings 530 of threshold values of High Electron Mobility Transistors (HEMTs) with a back barrier layer at different positions, in accordance with some embodiments of the present disclosure. In one embodiment, a semiconductor device, includes: a Gallium Nitride (GaN) layer; a front barrier layer over the GaN layer; a source electrode, a drain electrode and a gate electrode formed over the front barrier layer; a 2-Dimensional Electron Gas (2-DEG) in the GaN layer at a first interface between the GaN layer and the front barrier layer; and a back barrier layer in the GaN layer, wherein the back barrier layer consists of Aluminum Nitride (AlN).

In another embodiment, a High Electron Mobility Transistor (HEMT), includes: a Gallium Nitride (GaN) layer; a front barrier layer over the GaN layer; a source electrode, a drain electrode, and a gate electrode formed over the front barrier layer; a 2-Dimensional Electron Gas (2-DEG) in the GaN layer at a first interface between the GaN layer and the front barrier layer; and a back barrier layer in the GaN layer, wherein the back barrier layer consists of Aluminum Nitride (AlN).

Yet, in another embodiment, a method for manufacturing a High Electron Mobility Transistor, includes: forming a first portion of a Gallium Nitride (GaN) layer; depositing a back barrier layer on the first portion of the GaN layer; forming a second portion of the GaN layer over the back barrier layer; depositing a front barrier layer on the second portion of the GaN layer; and forming a source electrode, a drain electrode and a gate electrode on the front barrier layer, wherein the back barrier layer consists of Aluminum Nitride (AlN), and where a 2-Dimensional Electron Gas (2-DEG) in the second portion of the GaN layer at a first interface between the second portion of the GaN layer and the front barrier layer.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
- a first Gallium Nitride (GaN) layer comprising a first resistivity;
- a front barrier layer over the first GaN layer;
- a source electrode, a drain electrode and a gate electrode formed over the front barrier layer;
- a 2-Dimensional Electron Gas (2-DEG) in the first GaN layer at a first interface between the first GaN layer and the front barrier layer;
- a back barrier layer under the first GaN layer, wherein the back barrier layer comprises Aluminum Nitride (AlN);
- a second GaN layer under the back barrier layer, wherein the second GaN layer comprises a second resistivity; and
- a third GaN layer under the second GaN layer, wherein the third GaN layer comprises a third resistivity,
- wherein the third resistivity is higher than the second resistivity.

2. The semiconductor device of claim 1, wherein the front barrier layer comprises Aluminum Gallium Nitride ($Al_xGa_{1-x}N$), and wherein 0≤x≤1.

3. The semiconductor device of claim 1, wherein the back barrier layer is located under the first GaN layer separated from the first interface by a first thickness of a first portion of the first GaN layer.

4. The semiconductor device of claim 3, wherein the first thickness is in a range of 25 to 350 nanometers.

5. The semiconductor device of claim 1, wherein a second thickness of the back barrier layer is in a range of 0.5 and 10 nanometers.

6. The semiconductor device of claim 1, wherein electrons in the 2-DEG in the first GaN layer at the first interface is blocked by a second interface between a first portion of the first GaN layer and the back barrier layer.

7. The semiconductor device of claim 1, wherein a third thickness of the first GaN layer is in a range of 300 and 1500 nanometers.

8. A High Electron Mobility Transistor (HEMT), comprising:
- a first Gallium Nitride (GaN) layer;
- a front barrier layer over the first GaN layer;
- a source electrode, a drain electrode, and a gate electrode formed over the front barrier layer;
- a 2-Dimensional Electron Gas (2-DEG) in the first GaN layer at a first interface between the first GaN layer and the front barrier layer;
- a back barrier layer under the first GaN layer, wherein the back barrier layer comprises Aluminum Nitride (AlN);
- a second GaN layer under the back barrier layer, wherein the second GaN layer comprises a second resistivity; and
- a third GaN layer under the second GaN layer, wherein the third GaN layer comprises a third resistivity,
- wherein the third resistivity is higher than the second resistivity.

9. The HEMT of claim 8, wherein the front barrier layer comprises Aluminum Gallium Nitride ($Al_xGa_{1-x}N$), and wherein 0≤x≤1.

10. The HEMT of claim 8, wherein the back barrier layer is located under the first GaN layer separated from the first interface by a first thickness of a first portion of the first GaN layer.

11. The HEMT of claim 10, wherein the first thickness is in a range of 25 and 350 nanometers.

12. The HEMT of claim 8, wherein a second thickness of the back barrier layer is in a range of 0.5 and 10 nanometers.

13. The HEMT of claim 8, wherein electrons in the 2-DEG in the first GaN layer at the first interface is blocked by a second interface between a first portion of the first GaN layer and the back barrier layer.

14. The HEMT of claim 8, wherein a third thickness of the first GaN layer is in a range of 300 and 1500 nanometers.

15. A High Electron Mobility Transistor (HEMT), comprising:

a first Gallium Nitride (GaN) layer;

a front barrier layer over the first GaN layer;

a source electrode, a drain electrode, and a gate electrode formed over the front barrier layer;

a 2-Dimensional Electron Gas (2-DEG) in the first GaN layer at a first interface between the first GaN layer and the front barrier layer; and a back barrier layer under the first GaN layer, wherein the back barrier layer comprises Aluminum Nitride (AlN), a second GaN layer under the back barrier layer, wherein the second GaN layer comprises a second resistivity, a third GaN layer under the second GaN layer, wherein the third GaN layer comprises a third resistivity, a buffer layer under the third GaN layer, wherein the third resistivity is higher than the second resistivity.

16. The HEMT of claim 15, wherein the buffer layer comprises at least one of the following:

Aluminum (Al),

Gallium (Ga), and

Indium (In) in forms of binary, ternary or tertiary compounds.

17. The HEMT of claim 15, wherein the front barrier layer comprises Aluminum Gallium Nitride ($Al_xGa_{1-x}N$), and wherein 0≤x≤1.

18. The HEMT of claim 15, wherein the back barrier layer is located under the first GaN layer separated from the first interface by a first thickness of a first portion of the first GaN layer.

19. The HEMT of claim 18, wherein the first thickness is in a range of 25 and 350 nanometers.

20. The HEMT of claim 15, wherein electrons in the 2-DEG in the first GaN layer at the first interface is blocked by a second interface between a first portion of the first GaN layer and the back barrier layer.

* * * * *